United States Patent
Jacobs et al.

(10) Patent No.: US 7,507,664 B2
(45) Date of Patent: *Mar. 24, 2009

(54) TUNGSTEN PLUG CORROSION PREVENTION METHOD USING IONIZED AIR

(75) Inventors: John W. Jacobs, Granite Bay, CA (US); Elizabeth A. Dauch, Rocklin, CA (US)

(73) Assignee: NEC Electronics America, Inc., Santa Clara, CA (US)

( * ) Notice: Subject to any disclaimer, the term of this patent is extended or adjusted under 35 U.S.C. 154(b) by 167 days.

This patent is subject to a terminal disclaimer.

(21) Appl. No.: 11/443,483

(22) Filed: May 30, 2006

(65) Prior Publication Data

US 2006/0292869 A1    Dec. 28, 2006

Related U.S. Application Data

(63) Continuation of application No. 10/695,528, filed on Oct. 28, 2003, now Pat. No. 7,052,992.

(51) Int. Cl.
*H01L 21/44* (2006.01)
*H01L 21/4763* (2006.01)

(52) U.S. Cl. .................... 438/685; 438/672; 438/620

(58) Field of Classification Search ............... 438/685, 438/672, 620
See application file for complete search history.

(56) References Cited

U.S. PATENT DOCUMENTS

2004/0152305 A1*   8/2004   Yiu et al. .................... 438/685

* cited by examiner

*Primary Examiner*—Luan C Thai
(74) *Attorney, Agent, or Firm*—Campbell Stephenson LLP (57) ABSTRACT

Disclosed herein is a method of making integrated circuits. In one embodiment the method includes forming tungsten plugs in the integrated circuit and forming electrically conductive interconnect lines in the integrated circuit after formation of the tungsten plugs. At least one tungsten plug is electrically connected to at least one electrically conductive interconnect line. Thereafter at least one electrically conductive interconnect line is exposed to ionized air.

27 Claims, 5 Drawing Sheets

TUNGSTEN PLUG CORROSION PREVENTION METHOD USING IONIZED AIR

CROSS-REFERENCE TO RELATED APPLICATIONS

This application is a continuation of U.S. patent application Ser. No. 10/695,528, entitled "Tungsten Plug Corrosion Prevention Method Using Ionized Air," filed Oct. 28, 2003, and naming John W. Jacobs and Elizabeth A. Dauch as inventors, now U.S. Pat. No. 7,052,992, issued May 30, 2006.

BACKGROUND OF THE INVENTION

Interconnect lines electrically connect devices within an integrated circuit (IC). IC devices may include one or more complimentary metal oxide semiconductor (CMOS) transistors having diffused source and drain regions separated by channel regions, and gates that are located over the channel regions. In practice, an IC may include thousands or millions of devices, such as CMOS transistors.

Interconnect lines of ICs generally take the form of patterned metallization layers. Interconnect lines may be formed one on top of another with an electrically insulating material therebetween. As will be more fully described below, one interconnect line may be formed under another interconnect line and electrically connected thereto by one or more tungsten plugs.

Figure 1:
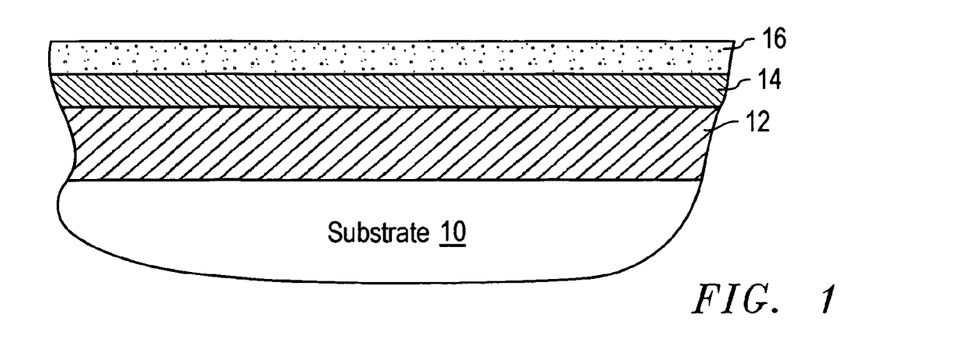
FIG. 1 is a cross-sectional view of a portion of a partially fabricated integrated circuit.

ICs are manufactured on silicon substrates, often called wafers, using conventional photolithographic techniques. FIGS. 1-8 show a cross-sectional view of an IC during a portion of its manufacture. More particularly, FIG. 1 shows a first dielectric layer 12, a first metallization layer 14, and a photoresist layer 16 formed over substrate 10. Layers 12-16 are formed using conventional techniques such as chemical vapor deposition, sputtering, or spin-on coating.

Figure 2:
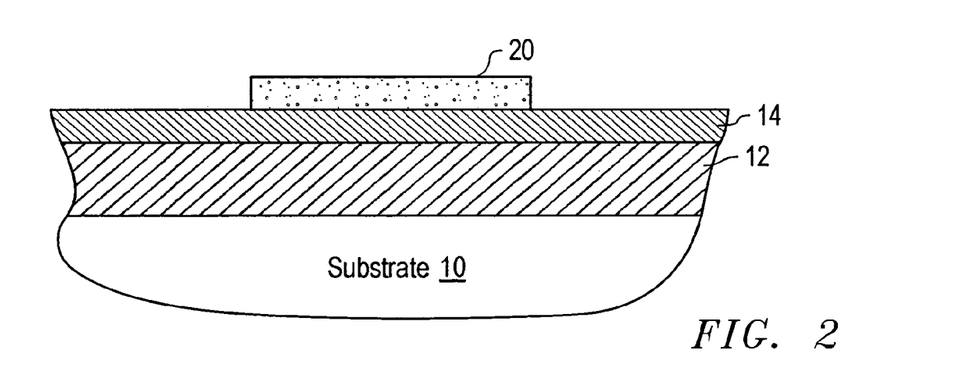
FIG. 2 shows the IC of FIG. 1 after patterning the photoresist layer to form photoresist mask pattern.

First metallization layer 14 can be formed into a first interconnect line. This first interconnect line can be formed by selectively exposing photoresist layer 16 to light passing through a patterned reticle (not shown). Photoresist areas of layer 16 exposed to light are subsequently removed using conventional development techniques. FIG. 2 shows the substrate 10 of FIG. 1 after development of photoresist layer 16 to form photoresist mask pattern 20.

Figure 3:
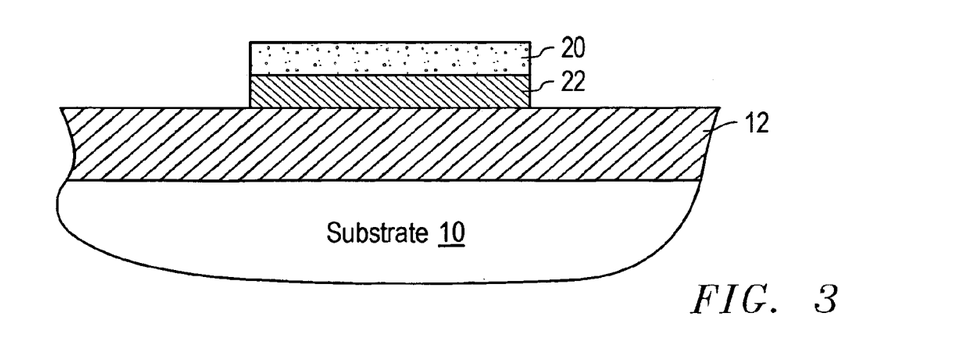
FIG. 3 shows the IC of FIG. 2 after etching the first metallization layer.

Once the photoresist mask pattern 20 is formed, a plasma etching operation is applied to the IC shown in FIG. 2 to remove portions of metallization layer 14 that are not covered by photoresist mask pattern 20. FIG. 3 shows the IC of FIG. 2 after plasma etching thereof. The plasma etching operation results in first interconnect line 22.

Figure 4:
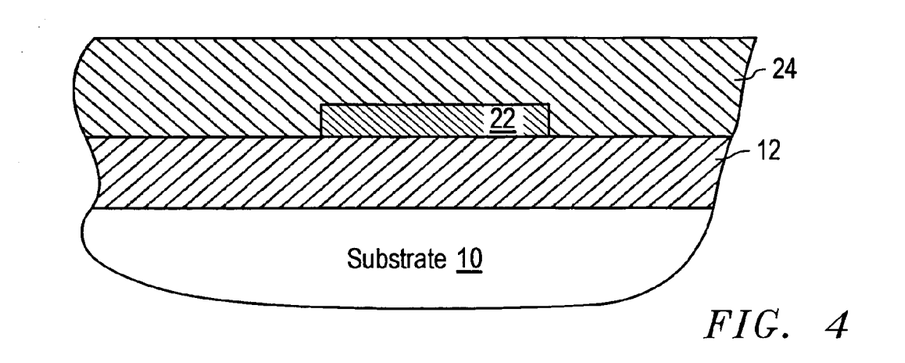
FIG. 4 illustrates the IC of FIG. 3 with a second dielectric layer formed thereon.

FIG. 4 shows the IC of FIG. 3 after a second dielectric layer 24 is deposited thereon. Although not shown, photoresist mask pattern 20 is removed prior to formation of second dielectric layer 24. The second dielectric layer 24 and the first dielectric layer 12 may be formed from an insulating material such as silicon dioxide.

Figure 5:
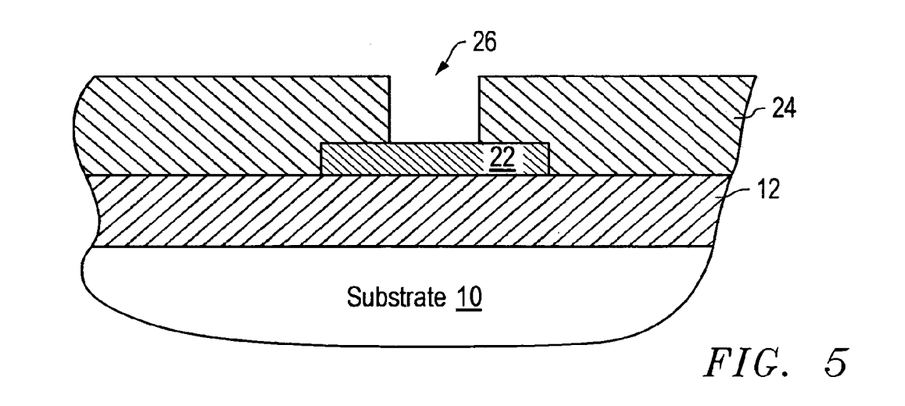
FIG. 5 illustrates the IC of FIG. 4 after formation of a via within the second dielectric layer.

FIG. 5 shows the IC of FIG. 4 after a via 26 is formed within the second dielectric layer 24. As is well known in the art, vias, such as via 26, are formed by depositing a photoresist layer (not shown) over dielectric layer 24, selectively exposing this photoresist layer to light passing through a patterned reticle having via hole patterns formed therein, developing and removing the exposed photoresist to form a photoresist via mask pattern, etching any dielectric layer 24 exposed through the photoresist via mask pattern, and removing the remaining photoresist via mask after etching dielectric layer 24.

Figure 6:
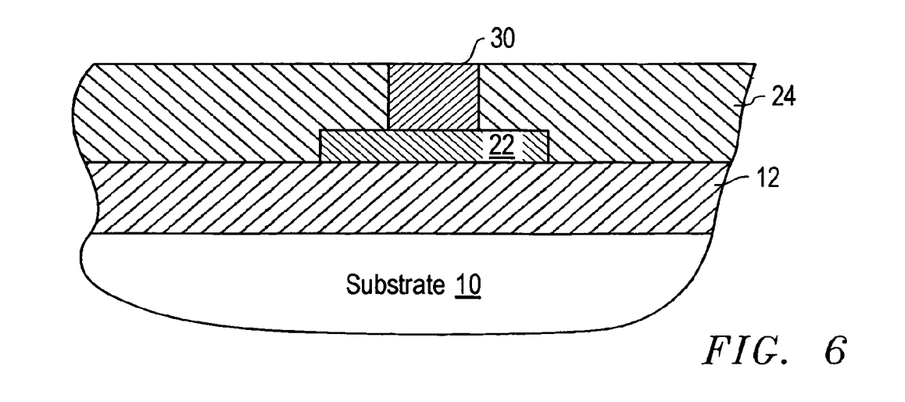
FIG. 6 shows the IC of FIG. 5 with a tungsten plug formed therein.

Once the vias are formed within the second dielectric layer 24, the vias are filled with an electrically conductive material such as tungsten. As well is known in the art, vias, such as via 26, are filled by depositing a barrier film by sputter or chemical vapor deposition, depositing a conductive film by sputter or chemical vapor deposition, and then removing the conductive film, and possibly removing the barrier film, over dielectric layer 24, but not inside the via 26. The barrier film is typically comprised of titanium, titanium nitride, or a titanium/titanium nitride stack. The conductive film is typically tungsten. The conductive film, and possibly the barrier film, is removed by plasma etching, chemical mechanical polishing, or wet etching. FIG. 6 shows via 26 of FIG. 5 filled with tungsten, thereby forming tungsten plug 30.

Figure 7:
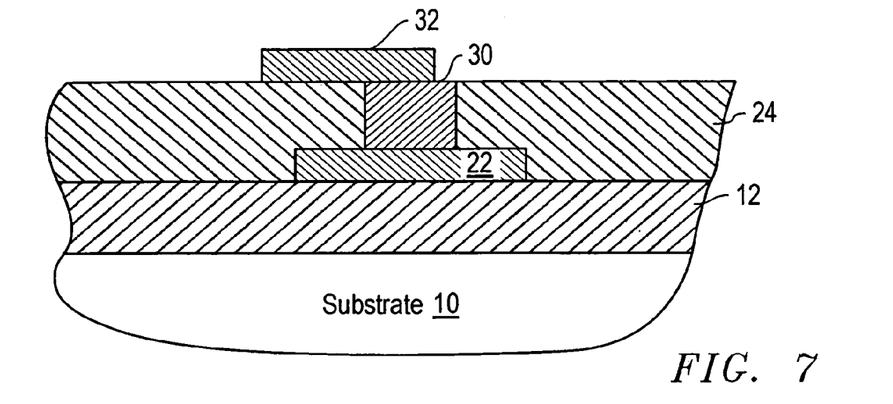
FIG. 7 shows the IC of FIG. 6 after formation of a second interconnect line thereon.

After the tungsten plugs are formed, a second metallization layer is formed over dielectric layer 24 and the tungsten plugs, including tungsten plug 30. This metallization layer is typically comprised of a metal stack that includes any combination of one or more the following: titanium, titanium nitride, aluminum, an aluminum copper alloy, or an aluminum silicon copper alloy. This metallization layer is then patterned using conventional photolithography and plasma etching to form an additional layer of interconnect lines. FIG. 7 shows the IC of FIG. 6 with a second interconnect line 32 formed thereon. The second interconnect line 32 is electrically coupled to the first interconnect line 22 via the tungsten plug 30. First interconnect line 22 may be coupled at one end to a first device (i.e., a first CMOS transistor). The second interconnect line 32 may be coupled to a second device (i.e., a second CMOS transistor) or coupled to connections which lead to the outside of the chip package. Accordingly, the structure of the first interconnect line 22, tungsten plug 30, and second interconnect line 32, function to interconnect the first and second IC devices or function to interconnect an IC device and external package connections.

As is well known in the art, conventional plasma etching to form interconnect lines (e.g., interconnect line 32) often leaves residual polymer (not shown) on the sides of the interconnect lines. To remove this residual polymer on the sides of the interconnect lines, a liquid cleaning solution is often used after plasma etch. Further, conventional plasma etching to form interconnect line 32 may leave a positive electrical charge on interconnect line 32, and thus, tungsten plug 30 and first interconnect line 22. For purposes of explanation, it will be presumed that the structure consisting of first interconnect line 22, tungsten plug 30, and second interconnect line 32 is a floating structure such that both interconnect lines 22 and 32 and tungsten plug 30 will be positively charged before the polymer residue removal process.

After plasma etching, the IC shown in FIG. 7 is exposed to a cleaning solution to remove any polymer remaining after the plasma etching step. Typically this cleaning solution may be alkaline or basic in nature (i.e. pH is greater than 7), however, acidic solutions (i.e. pH is less than 7) can also be used. Although the cleaning solution works well in removing polymer residues, one, some, or all of the tungsten plugs that are exposed to the cleaning solution may dissolve or erode away during the polymer residue removal process. The cause is electrochemical corrosion caused by two dissimilar conductive materials being in contact, the interconnect line and the tungsten plug, while both conductive materials are simultaneously in contact with an electrolyte, the cleaning solution or rinsing solution, during the polymer removal process.

More and more devices are packed into smaller ICs. As such, the density of devices and interconnect lines in ICs has dramatically increased over the years. Unfortunately, this dense integration of devices and interconnect lines has the effect of pushing the limits of conventional photolithography patterning, which necessarily makes photolithography masks misalignments more likely to occur. An increase in misalignments will result in an increase of exposed tungsten plugs.

FIG. 7 illustrates the effects of misalignment of photolithography masks. More particularly, the misalignment of photolithography masks used to create second interconnect line 32 produces a misalignment of second interconnect line 32 with respect to tungsten plug 30. As a result of this misalignment, tungsten plug 30 will be exposed to cleaning solution during the polymer residue removal step described above.

Figure 8:
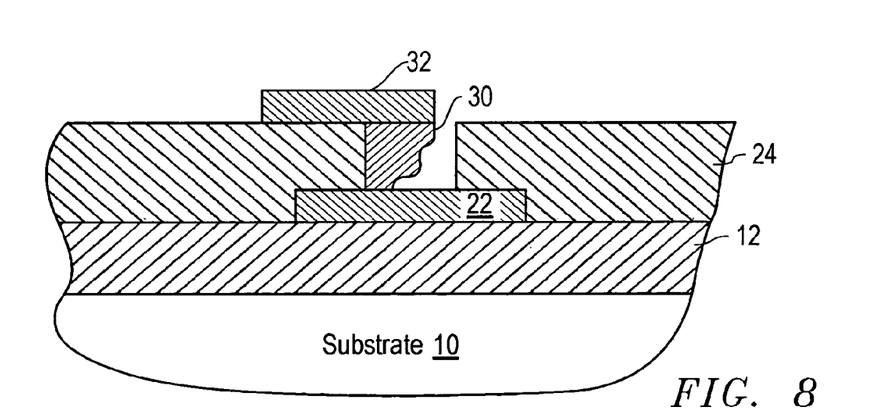
FIG. 8 shows the IC of FIG. 7 after exposure to a cleaning solution to remove polymer residue.

FIG. 8 illustrates how tungsten plug 30 could be corroded by the cleaning or rinsing solution of the polymer residue removal process. As seen in FIG. 8, a substantial portion of tungsten plug 30, is removed by the aforementioned corrosion. Tungsten plug corrosion may have adverse effects on performance of the IC. For example, corrosion of tungsten plug 30 shown in FIG. 8 may be so extensive that first interconnect line 22 is no longer electrically coupled to second interconnect line 32 thereby creating an open circuit therebetween. IC devices coupled to second interconnect line 32 could be electrically isolated from IC devices coupled to first interconnect line 22 thereby resulting in an IC that fails to function for its intended purpose.

Clearly, there is a need to avoid tungsten plug corrosion in the manufacture of ICs. In 1998, a paper was published by S. Bothra, H. Sur, and V. Liang, entitled, "A New Failure Mechanism by Corrosion of Tungsten in a Tungsten Plug Process," IEEE Annual International Reliability Physics Symposium, pages 150-156. This paper, which is incorporated herein by reference in its entirety, describes some techniques for preventing tungsten plug corrosion. These techniques involve discharging the tungsten plugs prior to immersion in alkaline cleaning solution to remove polymer residue. In one technique described in the paper, tungsten plug discharge is accomplished by flooding ICs with an electron-beam prior to polymer residue removal. The paper found that blanket electron-beam flooding of ICs was enough to discharge exposed tungsten plugs, such as the exposed tungsten plug shown in FIG. 7, such that the exposed tungsten plugs were found to remain in tact after subsequent emersion in the alkaline cleaning solution. The paper said this method was found to be effective without any associated drawbacks. The paper stated that a variety of devices for discharging surfaces to prevent ESD (electrostatic discharge) failures in the clean rooms are available in the market place. However, the paper found that experiments with a few hand-held devices failed, presumably because the electron density is not high enough. It is noted that this paper should not be considered prior art to the invention claimed herein.

SUMMARY OF THE INVENTION

Disclosed herein is a method of making integrated circuits. In one embodiment the method includes forming tungsten plugs in the integrated circuit and forming electrically conductive interconnect lines in the integrated circuit after formation of the tungsten plugs. At least one tungsten plug is electrically connected to at least one electrically conductive interconnect line. Thereafter the at least one electrically conductive interconnect line is exposed to ionized air.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood in its numerous objects, features, and advantages made apparent to those skilled in the art by referencing the accompanying drawings.

The use of the same reference symbols in different drawings indicates similar or identical items.

DETAILED DESCRIPTION

The present invention relates to a method of making ICs. In one embodiment the method includes forming a tungsten plug in a dielectric layer and forming an electrically conductive interconnect line partially or completely covering the tungsten plug after formation of the tungsten plug. FIG. 7 illustrates an exemplary, partially formed IC in which interconnect line 32 is formed after formation of dielectric layer 24 and tungsten plug 30. The electrically conductive interconnect line 32 in FIG. 7, may be formed from conductive materials such as a metal stack comprised of any combination of one or more of the following: titanium, titanium nitride, aluminum, an aluminum copper alloy, or an aluminum silicon copper alloy. The Tungsten plug 30 is electrically connected to conductive interconnect line 32. The tungsten plug 30 in FIG. 7 may have a metal barrier film surrounding it (between the dielectric layer 24 and the tungsten plug 30). This metal barrier film may be formed from conductive materials such as a metal stack comprised of any combination of one or more of the following: titanium, titanium nitride, titanium tungsten, or tungsten nitride.

As noted above, formation of conductive line 32 may result in an unwanted polymer residue. Moreover, formation of a conductive line 32 may result in the accumulation of electrical charge on the conductive line 32, the tungsten plug 30 connected thereto and the underlying conductive line 22 connected to tungsten plug 30. The polymer residue may be removed by exposing the partially formed IC of FIG. 7 to a cleaning solution. Before the polymer residue removal step, but after the formation of the conductive interconnect line 32, the partially formed IC including interconnect line 32, is exposed to ionized air. In one embodiment, the partially formed IC is exposed to ionized air when it is in a physically stationary state. This physically stationary state can be in a variety of forms, including, but not limited to sitting on a table or bench top, such as a wafer staging area; sitting in, within, or on a process tool, such as in a load lock, cooling or heating station, notch or flat indexer, or on a robot arm; or sitting in an enclosed area, such as a wafer stocker, lot box, front opening unified pod (FOUP), or Standard Mechanical Interface Pod (SMIF-Pod). In another embodiment, the partially formed IC is exposed to ionized air while the partially formed IC is moving. ICs are often moved during their manufacture. For example, ICs are moved in a process tool, such as moving from one chamber or stage to another chamber or stage. ICs are often moved from one process tool to another process tool, such as moving within a wafer stocker. ICs may be moved from one wafer carrier to another wafer carrier, such as wafer transfer from one cassette, boat, FOUP, or SMIF to another cassette, boat, FOUP, or SMIF. In one embodiment, the partially formed IC is contacted with ionized air for a period of time equal to or less than 60 seconds while the partially formed IC is stationary or moving, it being understood that the present invention should not be limited to ionized air exposure of 60 seconds or less. Indeed, the exposure time may exceed 60 seconds.

Figure 9:
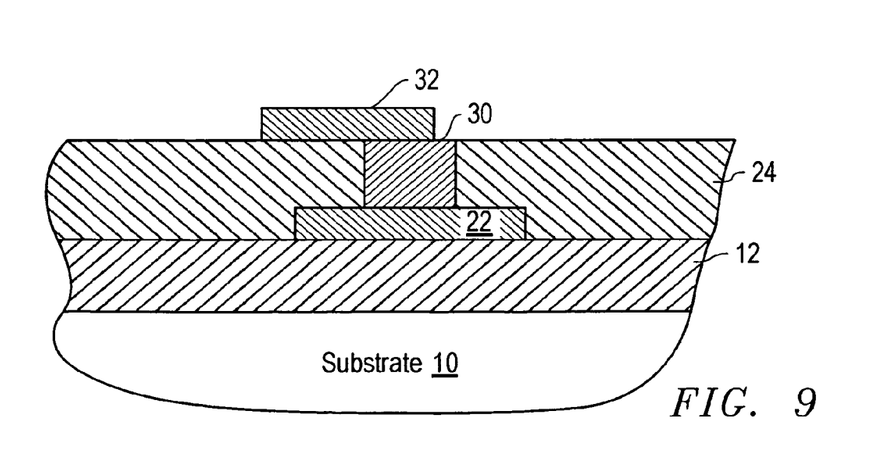
FIG. 9 illustrates the IC of FIG. 7 after exposure to both ionized air and a cleaning solution to remove polymer residue, with the exposure to ionized air being before the exposure to a cleaning solution.

The contact with the ionized air fully or partially discharges conductive interconnect line 32 and tungsten plug 30 connected thereto and the underlying conductive line 22 connected to tungsten plug 30. It is noted that ICs may be created with more than two levels of interconnect lines. Interconnect lines 32 and 22 in FIG. 9 are lines in two separate levels. Ideally, each time a level of interconnect lines is formed, the newly formed interconnect lines should be contacted with ionized air.

The ionized air partially or fully discharges conductive interconnect line 32 and tungsten plug 30 connected thereto and the underlying conductive line 22 connected to tungsten plug 30. This is accomplished by interconnect line 32 (and tungsten plug 30 if not covered by interconnect line 32) engaging positive and/or negative ions surrounding the partially formed IC. The positive and/or negative ions neutralize the opposite polarity charge on the interconnect line 32, tungsten plug 30 connected thereto and the underlying conductive line 22 connected to tungsten plug 30. In one embodiment of the present invention, ionized air composed of nitrogen, oxygen, carbon dioxide, and/or argon ions, under ambient atmosphere is used to discharge conductive interconnect line 32, tungsten plug 30 connected thereto and the underlying conductive line 22 connected to tungsten plug 30. Other similar ions can be used as well. Generally, conductive interconnect line 32, tungsten plug 30 connected thereto and the underlying conductive line 22 connected to tungsten plug 30 on the wafer surface is discharged after exposure of interconnect line 32 (and tungsten plug 30 if not covered by interconnect line 32) to the ionized air for only a short period of time, e.g., 60 seconds or less, it being understood that the present invention should not be limited thereto. In one embodiment, exposing the conductive interconnect line 32 (and tungsten plug 30 if not covered by interconnect line 32) to ionized air during a wafer transfer process (e.g., illustrated in FIG. 11) is sufficient.

The partially formed IC of FIG. 7 is processed in accordance with an embodiment of the present invention. More particularly, the partially formed IC including conductive interconnect line 32 and tungsten plug 30, is exposed to ionized air prior the polymer residue removal step described above. FIG. 9 shows the results after (1) exposing the partially formed IC to ionized air, and (2) a subsequent residual polymer removal step. Comparing FIG. 9 to FIG. 8, it can be seen that tungsten plug 30, after the polymer residue removal step, is not corroded and provides a more reliable electrical connection between conductive interconnect line 32 and conductive interconnect line 22.

It will be recognized that the present invention can be extended to processes for fabricating integrated circuits different from that shown in FIG. 7, but yet ones that experience the aforementioned problem of corrosion of conductive material. For example, other forms of integrated circuits may include additional or fewer conductive interconnect layers, a barrier layer may exist around tungsten plug 30, the plug material may be something other than tungsten, and so on.

Figure 10A:
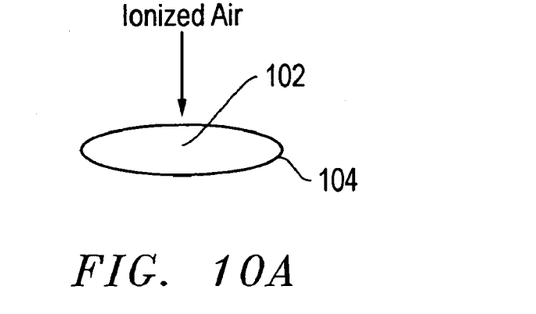
FIG. 10A-10C illustrates wafers, which contain ICs on their surface, exposed to ionized air in accordance with embodiments of the present invention.
Figure 10B:
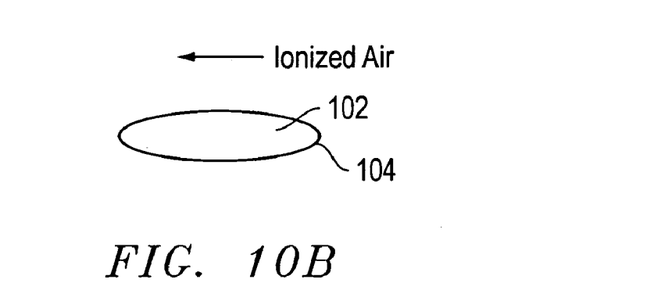
Figure 10C:
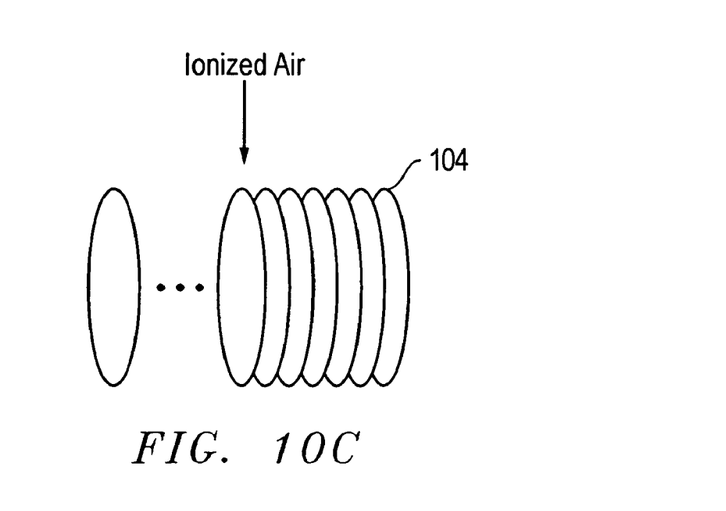

FIGS. 10A-10C illustrate one or more wafers which contain ICs or partially formed ICs such as that shown in FIG. 7 before the residual polymer removal step described above. FIGS. 10A and 10B show that the ICs can be exposed to ionized air directed along different directions with respect to the wafer. FIG. 10A illustrates ionized air directed in a flow perpendicular to a planar surface 102 of wafer 104. FIG. 10B illustrates ionized air directed in a flow parallel to planar surface 102 of wafer 104. FIG. 10C shows that more than one wafer may be simultaneously exposed to ionized air. FIG. 10C illustrates a number of wafers 104 exposed to ionized air directed in a flow generally parallel to planar surfaces of the wafers. The wafers of FIG. 10C can be included in a wafer carrier for example, which is not shown in order to aid in clarity.

Figure 11:
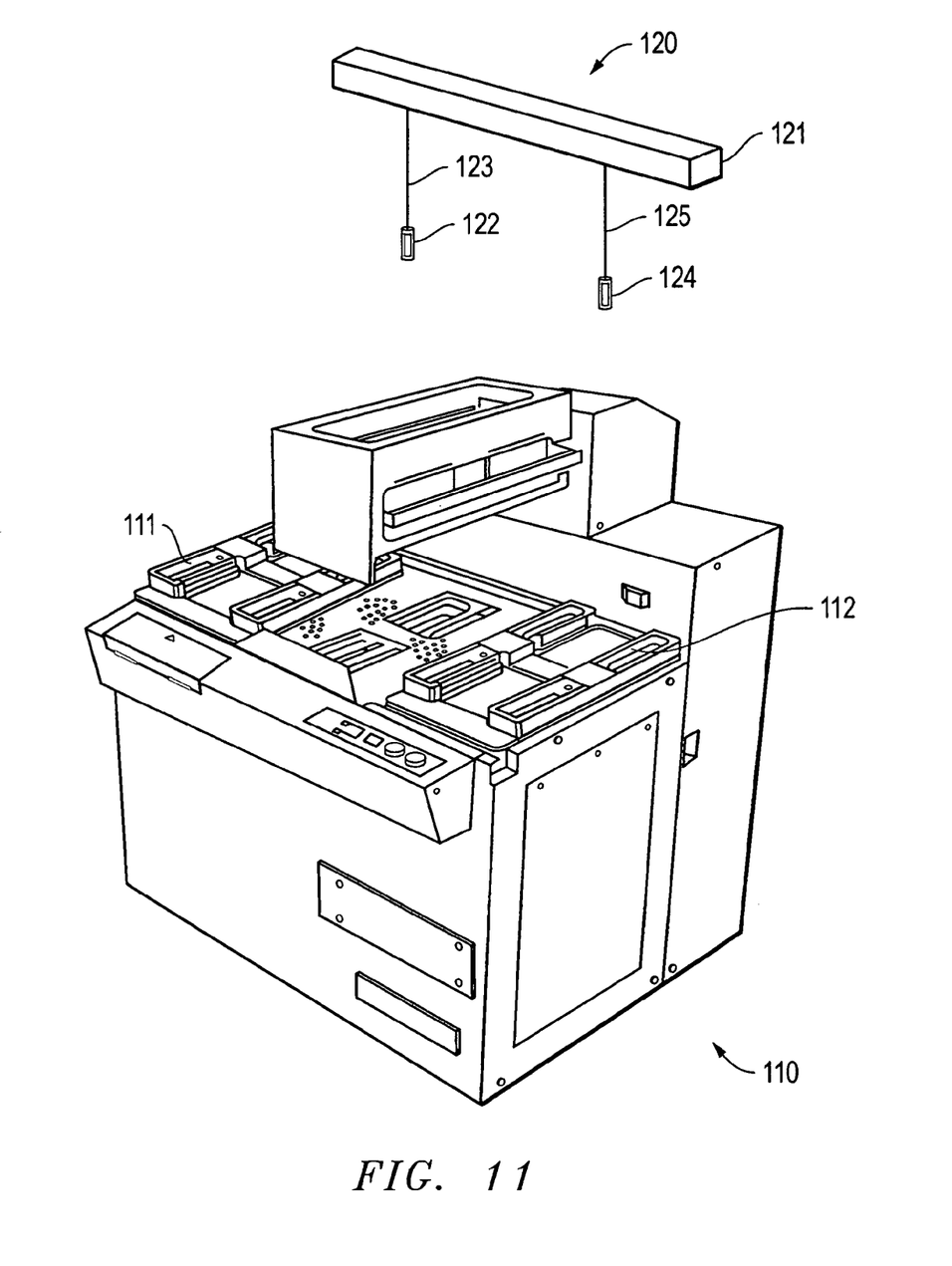
FIG. 11 illustrates an embodiment of the present invention utilized with a wafer transfer stage of a wafer fabrication process.

FIG. 11 illustrates a wafer transfer stage of a wafer fabrication process in which one embodiment of the present invention may be employed. Illustrated in FIG. 11 is a wafer transfer station 110 including a left wafer carrier station 111 and a right wafer carrier station 112. In operation, one or more wafers are transferred from left wafer carrier station 111 to right wafer carrier station 112, or vice versa. During part or all of transfer, the wafers are exposed to ionized air provided by ionizer 120. In one embodiment of the present invention, the transfer occurs after a point in which the conductive interconnect line 32 and tungsten plug 30 connected thereto and the underlying conductive line 22 connected to tungsten plug 30 on the wafer surface have become electrically charged, but prior to the exposure of conductive interconnect line 32 (and tungsten plug 30 if not covered by interconnect line 32) on the wafer surface to a liquid (e.g., a cleaning solution, rinsing solution, solvent, acidic or basic solution, and/or water).

In one embodiment of the present invention, ionizer 120 includes a housing 121, including one or more power supplies (not shown) and/or room sensors (not shown). Electrodes 122 and 124 are coupled to housing 121 via tubes 123 and 125, respectively. Electrodes 122 and 124 are placed approximately 1 meter above left and right wafer carrier stations 111 and 112, respectively, and provide positive and/or negative ions to areas around the wafer. In the presently described embodiment, ionizer 120 is oriented with each electrode in close proximity to each wafer carrier station, although other orientations may be used. In operation, wafers transferred by wafer transfer station 110 are exposed to ionized air provided by ionizer 120 during part or all of the wafer transfer process. When ionizer 120 is configured with a duty cycle of approximately 8 seconds, the wafers can be discharged in approximately 60 seconds or less. Ionizer model 5184 with controller 5024 produced by Ion Systems, Inc., of California is one example of ionizer 120.

Because the partially formed ICs formed on the wafer surface are exposed to ionized air during the wafer transfer process and after a point in which the conductive interconnect line 32, tungsten plug 30 connected thereto and the underlying conductive line 22 connected to tungsten plug 30 on the wafer surface have become electrically charged, but prior to the exposure of the partially formed ICs to a liquid (e.g., a cleaning solution, rinsing solution, solvent, acidic or basic solution, and/or water), there is generally no increase in the overall time of the wafer fabrication process. Additionally, because the present invention provides for the discharge of the conductive interconnect line, tungsten plug 30 connected thereto and the underlying conductive line 22 connected to tungsten plug 30 the wafer surface in ambient air pressure, low pressure chambers or vacuums are not necessary, thus the time and monetary costs of discharging the partially formed ICs, including conductive interconnect line, tungsten plug 30 connected thereto and the underlying conductive line 22 connected to tungsten plug 30, are minimized.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
   forming a tungsten plug in a dielectric layer;
   forming an electrically conductive interconnect line on the dielectric layer after the formation of the tungsten plug in the dielectric layer, wherein the tungsten plug is electrically connected to the electrically conductive interconnect line;
   exposing the electrically conductive interconnect line with ionized air after the formation of the electrically conductive interconnect line.

2. The method of claim 1 further comprising contacting the electrically conductive interconnect line with a solution to remove residual polymer after the electrically conductive interconnect line is exposed to ionized air.

3. The method of claim 2, wherein the liquid is one that is able to remove a photoresist material from the electrically conductive line.

4. The method of claim 1, further comprising exposing the electrically conductive interconnect line with ionized air during a transfer of a wafer in a wafer transfer system, wherein the electrically conductive interconnect line is included on the wafer.

5. The method of claim 1, wherein exposing the electrically conductive interconnect line to ionized air comprises exposing the electrically conductive interconnect line with at least one of positive ions and negative ions.

6. The method of claim 5, wherein exposing the electrically conductive interconnect line with ionized air comprises exposing the electrically conductive interconnect line with at least one of oxygen ions, nitrogen ions, carbon dioxide ions, and argon ions.

7. The method of claim 1, wherein exposing the electrically conductive interconnect line with ionized air comprises creating positive and/or negative ions in air around the electrically conductive interconnect line.

8. The method of claim 7, wherein exposing the electrically conductive interconnect line with ionized air comprises creating positive and/or negative ions in air from a point approximately 1 meter from the electrically conductive interconnect line.

9. The method of claim 1, further comprising exposing the electrically conductive interconnect line with ionized air after the formation of the electrically conductive interconnect line for approximately 60 seconds or less.

10. The method of claim 1 wherein the electrically conductive interconnect line is included on the wafer, and wherein the wafer is moving relative to a source of the ionized air as the electrically conductive interconnect line is exposed with ionized air.

11. The method of claim 1 wherein the electrically conductive interconnect line is included on the wafer, and wherein the wafer is stationary relative to a source of the ionized air as the electrically conductive interconnect line is exposed with ionized air.

12. The method of claim 1 wherein the electrically conductive interconnect line is included on a wafer surface, and wherein the wafer surface faces a source of the ionized air.

13. The method of claim 1 wherein the electrically conductive interconnect line is included on a wafer surface, and wherein the wafer surface is parallel to a stream of the ionized air.

14. An integrated circuit produced by a method comprising:
   forming a tungsten plug in a dielectric layer;
   forming an electrically conductive interconnect line on the dielectric layer after the formation of the tungsten plug in the dielectric layer, wherein the tungsten plug is electrically connected to the electrically conductive interconnect line;
   exposing the electrically conductive interconnect line with ionized air after the formation of the electrically conductive interconnect line.

15. The integrated circuit of claim 14, wherein the method further comprises contacting the electrically conductive interconnect line with a solution to remove residual polymer after exposing the electrically conductive interconnect line with ionized air.

16. The integrated circuit of claim 15, wherein the liquid is one that is able to remove a photoresist material from the electrically conductive line.

17. The integrated circuit of claim 14, wherein the method further comprises exposing the electrically conductive interconnect line with ionized air during a transfer of a wafer in a wafer transfer system, wherein the electrically conductive interconnect line is included on the wafer.

18. The integrated circuit of claim 14, wherein the method further comprises exposing the electrically conductive interconnect line with at least one of positive ions and negative ions.

19. The integrated circuit of claim 18, wherein the method further comprises exposing the electrically conductive interconnect line with at least one of oxygen ions, nitrogen ions, carbon dioxide ions, and argon ions.

20. The integrated circuit of claim 14, wherein exposing the electrically conductive interconnect line with ionized air comprises creating positive and/or negative ions in air around the electrically conductive interconnect line.

21. The integrated circuit of claim 20, wherein the method further comprises exposing the electrically conductive interconnect line with ionized air comprises creating positive and/or negative ions in air from a point approximately 1 meter from the electrically conductive interconnect line.

22. The integrated circuit of claim 14, wherein the method further comprises exposing the electrically conductive interconnect line with ionized air after the formation of the electrically conductive interconnect line for approximately 60 seconds or less.

23. The integrated circuit of claim 14 wherein the electrically conductive interconnect line is included on the wafer, and wherein the wafer is moving relative to a source of the ionized air as the electrically conductive interconnect line is exposed with ionized air.

24. The integrated circuit of claim 14 wherein the electrically conductive interconnect line is included on the wafer, and wherein the wafer is stationary relative to a source of the ionized air as the electrically conductive interconnect line is exposed with ionized air.

25. The integrated circuit of claim 14 wherein the electrically conductive interconnect line is included on a wafer surface, and wherein the wafer surface faces a source of the ionized air.

26. The integrated circuit of claim 14 wherein the electrically conductive interconnect line is included on a wafer surface, and wherein the wafer surface is parallel to a stream of the ionized air.

27. An apparatus comprising:

a substrate comprising:

a tungsten plug formed in a dielectric layer;

an electrically conductive interconnect line formed on the dielectric layer, wherein the tungsten plug is electrically connected to the electrically conductive interconnect line;

an ionizer for generating ionized air, wherein the ionizer is positioned relative to the substrate so that the electrically conductive interconnect line receives the ionized air.

* * * * *